(12) United States Patent
Odake et al.

(10) Patent No.: US 6,251,189 B1
(45) Date of Patent: Jun. 26, 2001

(54) SUBSTRATE PROCESSING APPARATUS AND SUBSTRATE PROCESSING METHOD

(75) Inventors: Shigeru Odake; Naoki Matsumoto; Shinya Morita; Kouji Tometsuka, all of Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/502,219

(22) Filed: Feb. 11, 2000

(30) Foreign Application Priority Data

Feb. 18, 1999 (JP) .................................................. 11-039857

(51) Int. Cl.[7] .................................................... C23C 16/00
(52) U.S. Cl. ......................... 118/715; 118/724; 156/345; 204/298.15; 427/248.1
(58) Field of Search ...................... 118/724, 725, 118/715; 156/345; 204/298.15; 427/248.1

(56) References Cited

U.S. PATENT DOCUMENTS 5,484,484 * 1/1996 Yamaga et al. ...................... 118/719
5,632,820 * 5/1997 Taniyama et al. ................... 118/724

FOREIGN PATENT DOCUMENTS 9-242232   9/1997   (JP) .

* cited by examiner

*Primary Examiner*—Jeffrie R. Lund
(74) *Attorney, Agent, or Firm*—Oliff & Berridge, PLC

(57) ABSTRACT

The present invention is constituted so as to improve a quartz gas supply portion utilized in a normal pressure furnace, and to keep to a minimum the damage incurred by a normal pressure furnace by the shock from an earthquake. Quartz gas supply piping 25 for supplying a reactant gas is connected to a quartz reaction tube 4, which constitutes a furnace body. A stress concentration portion 23 for concentrating stress by prioritizing another location when vibration occurs in a furnace body is formed on this gas supply piping 25. The stress concentration portion 23 is disposed on the side of a source-side gas supply pipe 8, which is in front of a pipe clamp 21 that connects the source-side gas supply pipe 8 to a reaction tube-side gas supply pipe 7 mounted to the reaction tube 4. As a stress concentration portion 23, the simplest of V-grooves can be formed in the circumferential direction.

12 Claims, 5 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and substrate processing method, comprising a furnace constituting a quartz gas supply portion, which is connected to a reaction tube, and more particularly to an apparatus and method for eliminating the transmission to the reaction tube by way of the gas supply portion of a shock impacting on the furnace.

2. Description of the Related Art

For some time now, in accordance with the relationship between temperature and a process gas in a diffusion furnace, quartz has been utilized in a gas supply pipe leading to a reaction tube. As shown in FIG. 9, a reaction tube-side gas supply pipe 42 is integrally mounted to a quartz reaction tube 41. A quartz source-side gas supply pipe 43, which is linked to a reactant gas source, is connected to this reaction tube-side gas supply pipe 42 by a pipe clamp 44 to secure the respective flanges.

However, in general, quartz is a brittle material, and is disadvantageous in that it is easily damaged when impacted by a shock, such as that of an earthquake. The constitution of a diffusion furnace reaction chamber is such that the quartz reaction tube is manufactured in a practically integrated fashion, so that when a shock impacts this reaction tube, it is damaged easily, resulting in considerable losses when the reaction tube must be remanufactured. More specifically, as shown in FIG. 10, gas supply pipe 43 is affixed to the reaction tube 41 by being securely connected to gas supply pipe 42 via a pipe clamp 44. Thus, when an earthquake occurs, the shock directly impacts the reaction tube 41 via the gas supply pipes 42, 43, causing damage to the weld portion 45 of the base of gas supply pipe 42, which is the most brittle. For this reason, improvement of the gas supply portion is desirable in a furnace in which the reaction tube and gas pipes are constituted of quartz.

SUMMARY OF THE INVENTION

An object of the present invention is to provide a substrate processing apparatus and substrate processing method, which make it possible to improve the gas supply portion of a furnace by eliminating the above-mentioned problems of the prior art by absorbing a shock before it reaches the reaction tube.

A first invention is a substrate processing apparatus, having a furnace, in which a reaction tube for processing substrates, and gas piping, which is connected to the reaction tube, and which supplies a gas required for processing the above-mentioned substrates, are constituted of quartz, this substrate processing apparatus being characterized in that a stress concentration portion is disposed on the above-mentioned gas piping. Here, a stress concentration portion refers to an element on which stress is preferentially concentrated, and which breaks more readily than another element, when an outside force impacts on gas piping. This stress concentration portion can be constituted using a depression, a groove or a thin-skinned portion.

When an earthquake or the like occurs, and an outside force impacts on a substrate processing apparatus, stress is concentrated in the stress concentration portion of a gas pipe so that the stress concentration portion breaks preferentially to another element before a shock impacts the reaction tube. Because a stress concentration portion of a gas pipe breaks before a shock impacts the reaction tube, the reaction tube can be effectively protected from damage. Therefore, only a pipe needs to be replaced, replacement work is easy, and losses can be greatly reduced.

A second invention is a substrate processing apparatus according to the first invention, which comprises a scavenger for preventing the dissipation of gas from the end of the above-mentioned furnace, and which disposes the above-mentioned stress concentration portion on a gas pipe of inside the above-mentioned scavenger. Here, a scavenger refers to a reaction tube connecting element, which is located at the end of a furnace body in a thermal oxidation apparatus, thermal diffusion apparatus, CVD apparatus or the like, and which is designed to prevent the dissipation of a process gas and heat toward the clean bench side. A stress concentration portion is desirably located on the inside of a scavenger. This is so that when a gas pipe breaks, the leakage of gas to the outside of the apparatus can be reduced. Since the leakage of gas to the outside of the apparatus can be reduced, gas countermeasures at gas pipe rupture can be improved.

A third invention is a substrate processing apparatus according to either the first or second invention, in which gas piping is connected to the reaction tube by way of a pipe connector, and the above-mentioned stress concentration portion is disposed on a gas pipe of the opposite side of the reaction tube having the above-mentioned pipe connector therebetween. When a stress concentration portion is disposed on a gas pipe of the side opposite the reaction tube, it is the gas pipe of the side opposite the reaction tube which breaks, and because the gas pipe leading to the reaction tube side need not be replaced, replacement is easier and more economical.

A fourth invention is a substrate processing apparatus according to either the first or second invention, in which a stress concentration portion is formed by a groove cut radially in a gas pipe. The orientation of the groove is optional, and can be either the radial direction, or the axial direction, and groove depth is in the radial direction. Further, as for the number of grooves, there can either be a single groove, or a plurality of grooves, and a groove can either be a ring shape that is continuous around the entire circumference, or a groove that is partially formed around the circumference of a gas pipe. The shape of a groove can be a V-groove, a U-groove, or the like. By cutting a groove in a gas pipe, stress concentration readily occurs in the portion thereof, making same easily breakable.

A fifth invention is a substrate processing apparatus according to either the first or second invention, in which the above-mentioned stress concentration portion is disposed on a gas supply pipe of the gas piping, without being so disposed on a gas exhaust pipe. In this invention, it is better to dispose a stress concentration portion on a gas supply pipe. This is because the temperature of a gas supply pipe is higher than that of a gas exhaust pipe, and a bellows cannot be used in the connection between the reaction tube and the gas piping.

A sixth invention is a substrate processing apparatus according to either the first or second invention, in which the above-mentioned furnace is a normal pressure furnace of either a diffusion furnace or an oxidation furnace. The present invention is particularly effective for a normal pressure furnace, which utilizes a quartz tube diffusion furnace or oxidation furnace, because a quartz bellows cannot be produced.

A seventh invention is a substrate processing method for processing substrates in a reaction tube, wherein a furnace having gas piping connected to the reaction tube and constituted of quartz is provided, and stress for negating an outside force is made to occur in a concentrated fashion part way along the above-mentioned gas piping so that the outside force which impacts the furnace travels down the gas piping and is absorbed before reaching the above-mentioned reaction tube. Because the outside force is absorbed by stress before reaching the reaction tube, the outside force does not impact the reaction tube, making it possible to effectively prevent the breaking of the reaction tube by the outside force.

An eighth invention is a substrate processing method according to the seventh invention, wherein a scavenger is provided at from an end of the above-mentioned furnace for preventing the dissipation of a gas, the stress is made to occur in a concentrated fashion part way along a gas pipe inside the scavenger.

A ninth invention is a substrate processing method according to either the seventh or eighth invention, wherein the above-mentioned gas piping is connected to the reaction tube by way of a pipe connector, and the above-mentioned stress is caused to occur in a concentrated fashion part way along a gas pipe of the side opposite the reaction tube, having the above-mentioned pipe connector therebetween.

A tenth invention is a substrate processing method according to either the seventh or eighth invention, wherein a groove is formed by cutting radially part way along the above-mentioned gas piping, and the above-mentioned stress is caused to occur in a concentrated fashion at the location of the groove.

An eleventh invention is a substrate processing method according to either the seventh or eighth invention, which is constituted so as to cause the stress to occur in a concentrated fashion part way along a gas supply pipe, but not in a gas exhaust pipe, of the gas piping.

A twelfth invention is a substrate processing method according to either the seventh or eighth invention, by which the above-mentioned furnace is a normal pressure furnace of either a diffusion furnace or an oxidation furnace.

DESCRIPTION OF THE PREFERRED EMBODIMENTS

The aspects of the embodiment of the present invention will be explained hereinbelow.

Figure 1:
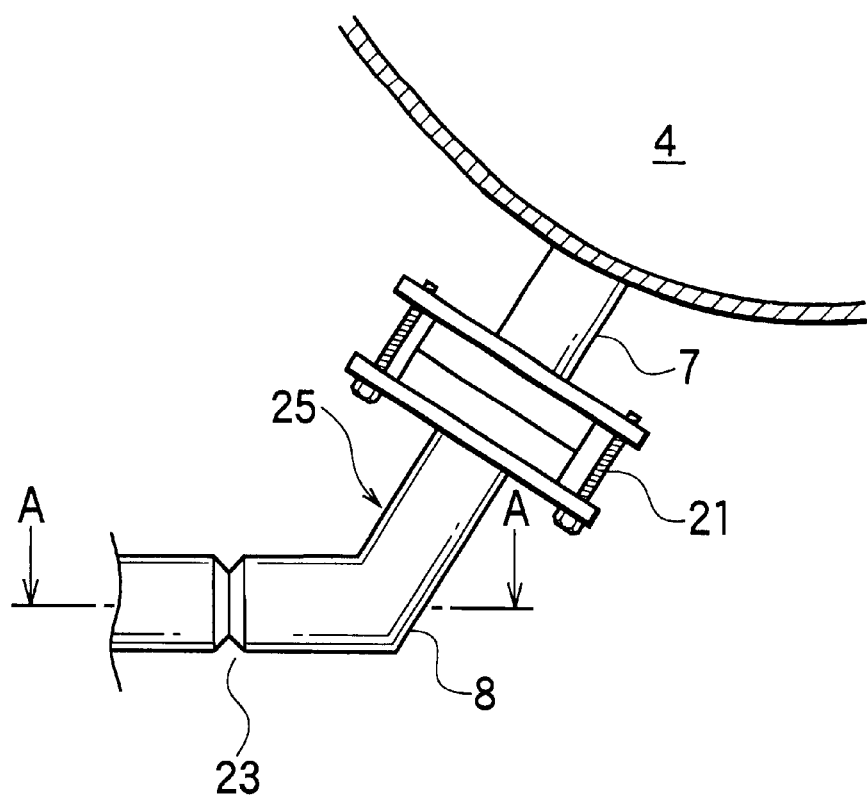
FIG. 1 is a schematic diagram of a quartz gas supply portion in a vertical furnace, showing an essential element of a substrate processing apparatus according to an aspect of the embodiment.
Figure 2:
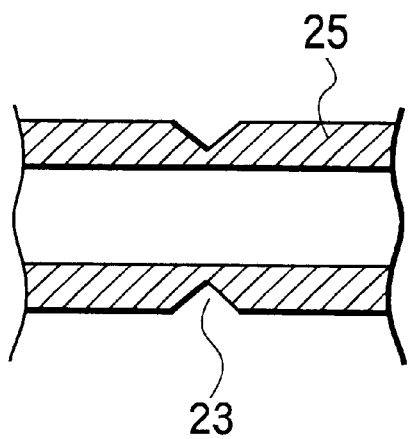
FIG. 2 is a cross-sectional view of A—A of FIG. 1.

A substrate processing apparatus of an aspect of the embodiment has a furnace, which, as shown in FIG. 1, FIG. 2, constitutes a quartz reaction tube 4 for processing a wafer as a substrate, and quartz gas supply piping 25 as gas piping, which is connected to the reaction tube, and which supplies a reactant gas required for processing a wafer. The gas supply piping 25 is fastened together midway to the reaction tube 4 by being connected by a pipe clamp 21, which is a pipe connector. A stress concentration portion 23 is disposed on this gas supply piping 25. This stress concentration portion 23 is disposed on a source-side gas supply pipe 8 of the side opposite the reaction tube 4, having therebetween pipe clamp 21, which connects a reaction tube-side gas supply pipe 7, which is integrally mounted to the reaction tube 4, to the source-side gas supply pipe 8, which leads to the reactant gas source side. The stress concentration portion 23 is formed parallel to the circumferential direction of gas supply pipe 8 (FIG. 1), and is in the shape of a radially-cut groove (FIG. 2). Disposing the groove in a location corresponding to the resonant frequency (or resonance direction) of the gas supply piping 25 and the reaction tube is more effective. When all sorts of vibration directions are taken into consideration, forming a V-groove around the entire circumference of a pipe is the best. Furthermore, a groove can be cut using a cutter. This is because using a cutter is the cheapest and simplest method.

When a stress concentration portion 23 is disposed part way along the gas supply piping 25 like this, stress resulting from the shock of an earthquake or the like travelling along the gas supply piping 25 is concentrated in the stress concentration portion 23, and the gas supply piping 25 breaks at this place, severing the propagation path of the shock. Therefore, a shock is not transmitted to the reaction tube 4, enabling the reaction tube 4 to be effectively protected from the shock, without damage occurring to the base weld portion, which is the most brittle, and without damage occurring to the reaction tube 4 itself.

Figure 3:
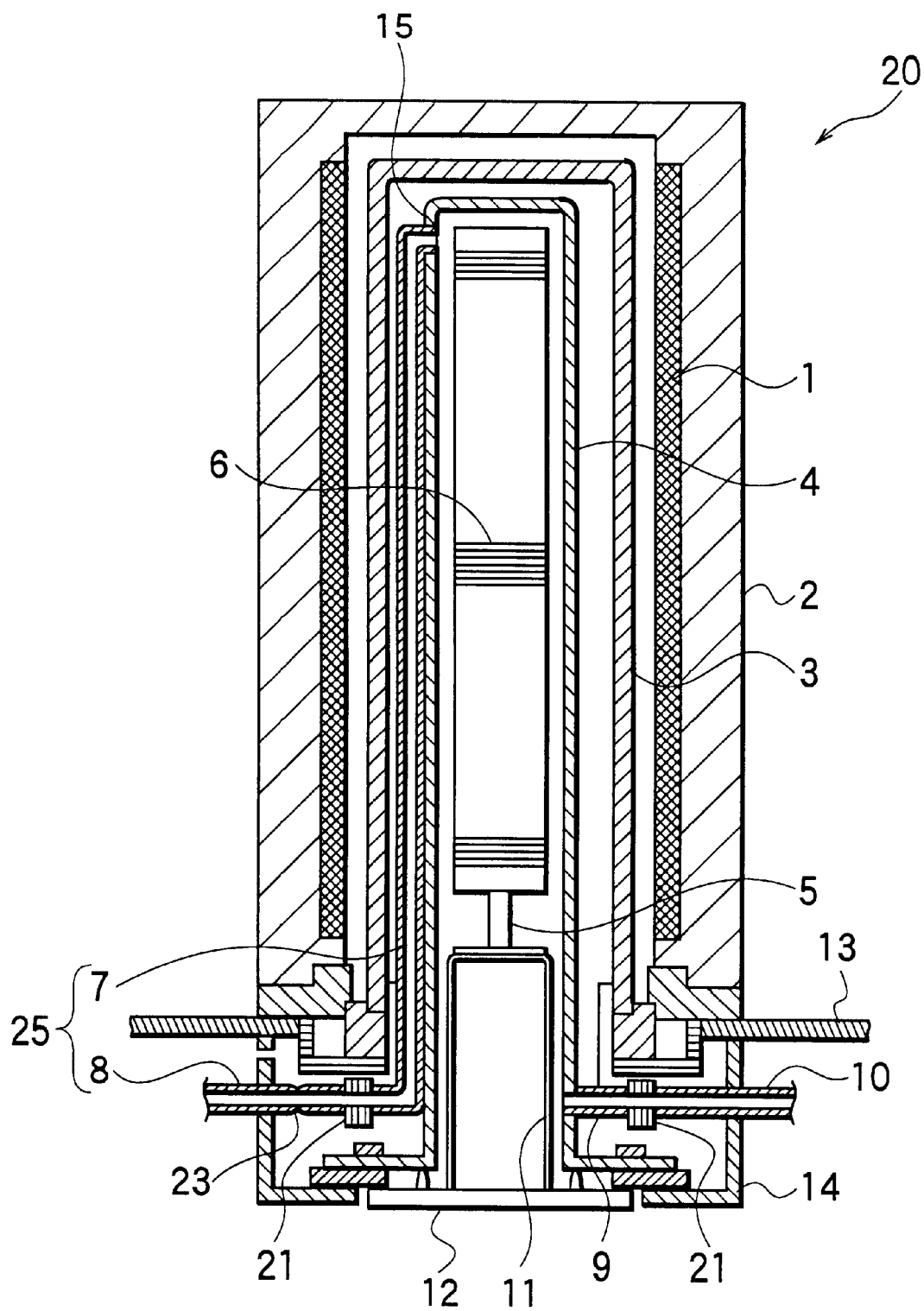
FIG. 3 is a cross-sectional view showing a vertical furnace according to an aspect of the embodiment.

Next, a concrete explanation will be given by using FIG. 3. FIG. 3 is a vertical-type normal pressure reaction furnace, comprising either a diffusion furnace, or an oxidation furnace. This reaction furnace 20 comprises a tubular heater 2, having a heating element 1, a soaking tube 3, which is housed in a space inside the heater 2, a quartz reaction tube 4, which is housed in a space inside the soaking tube 3, and a boat 5, which holds wafers 6 to be processed inside the reaction tube 4. Quartz gas supply piping 25 for supplying a reactant gas is connected to the reaction tube 4.

This gas supply piping 25 is constituted from a reaction tube-side gas supply pipe 7, and a source-side gas supply pipe 8. The reaction tube-side gas supply pipe 7 is disposed from the lower portion of one side of the reaction tube 4 along the reaction tube 4 to the upper portion of the reaction tube 4, the upper end is linked to the upper portion of the reaction tube 4, and the lower end is connected to the source-side gas supply pipe 8, which is linked to a reactant gas source (not shown in the figure). The connection between the reaction tube-side gas supply pipe 7 and the source-side gas supply pipe 8 is performed by repeatedly tightening the respective flanges of the gas supply pipes 7, 8 using a pipe clamp 21.

Further, a reaction tube-side exhaust pipe 9 is integrally mounted to the lower portion of the other side of the reaction tube 4, and a discharge-side exhaust pipe 10 is connected by a pipe clamp 21 to this reaction tube-side exhaust pipe 9.

The above-mentioned tubular heater 2 and soaking tube 3 are supported by a heater base 13. The lower portion of the above-mentioned reaction tube 4 is exposed by the central opening of this heater base 13. This exposed portion is located at the lower end of the furnace body, and is covered by a scavenger 14 mounted to the above-mentioned heater base 13. This scavenger 14 is connected to the reaction tube 4, and encloses the vicinity surrounding the furnace opening portion so that process gas and heat leaked from the pipe connector do not diffuse to the clean bench side. Further, an exhaust means, not shown in the figure, is connected to the scavenger 14, and is constituted so as to enable the discharge of gas which builds up inside. Furthermore, on the bottom portion of the scavenger 14, which connects to and supports the reaction tube 4, there is disposed an opening for loading/unloading a boat.

A boat 5 can be loaded with wafers 6 in a horizontal state in multiple stages having spaces therebetween, and holds a plurality of wafers 6 in this state inside the reaction tube 4. A boat 5 is placed on top of an elevator cap 12 by way of a boat cap 11, and can be moved up and down by an elevator (not shown in the figure). Therefore, loading wafers 6 into the reaction tube 4, and removing wafers 6 from the reaction tube 4 is performed in accordance with the operation of an elevator.

The formation of a thin film on a wafer 6 inserted into the reaction tube 4 is performed by generating a thin film on the surface of the wafer by causing the heating element 1 to generate heat, heating up the reaction tube 4 by way of the soaking tube 3, introducing a reactant gas inside the reaction tube 4 by way of the source-side gas supply pipe 8 and the reaction tube-side gas supply pipe 7, and then evacuating that gas from the reaction tube 4 by way of the reaction tube-side exhaust pipe 9 and the discharge-side exhaust pipe 10. Then, the removal of the wafer 6 on which a thin film has been formed is performed by shutting off heating in accordance with the heater 2, while continuing to discharge gas from exhaust pipe 9, and the operating an elevator, and withdrawing a boat 5 from the reaction tube 4 after the temperature inside the reaction tube 4 has dropped to a prescribed temperature.

Now then, the above-mentioned source-side gas supply pipe 8, which extends from the above-mentioned reactant gas source, is inserted inside the above-mentioned scavenger 14, and is connected to the reaction tube-side gas supply pipe 7 by a pipe clamp 21. The above-mentioned stress concentration portion 23, which absorbs the shock of an earthquake or the like, is disposed on the source-side gas supply pipe 8 inside this scavenger 14.

When an earthquake occurs, and produces a shock to a substrate processing apparatus, this shock travels toward the reaction tube 4 via the gas supply piping 25. But before the shock impacts on the reaction tube 4, the stress of that shock is concentrated in the stress concentration portion 23 of the source-side gas supply pipe 8. Therefore, stress is preferentially concentrated in the stress concentration portion 23 more than another gas supply piping location, preventing the shock from reaching the base 15 of the reaction tube-side gas supply pipe 7 mounted to the reaction tube 4. When the shock cannot be completely absorbed, the gas supply piping 25 will rupture at the stress concentration portion 23. When the stress concentration portion 23 of the gas supply pipe 8 breaks, the propagation of the shock to the reaction tube 4 is cut off, thus making it possible to effectively prevent damage to the reaction tube 4. Therefore, since this problem can be settled by replacing only a relatively short gas supply pipe 8, losses can be greatly reduced compared to replacing the reaction tube 4.

Gas leakage to the outside of an apparatus can be prevented, and gas countermeasures at gas supply pipe rupture can be improved when the gas supply pipe 8 breaks due to an earthquake, especially when the stress concentration portion 23 is disposed inside a scavenger 14. Further, a gas source is not ordinarily connected to the reaction tube 4 by 1 gas supply pipe, but rather gas supply piping is connected part way along by a pipe clamp 21. The reaction tube-side gas supply pipe 7, which is mounted directly to the reaction tube 4, is constituted long so as to be maintenance free, but the source-side gas supply pipe 8 of the side opposite the reaction tube 4 is constituted short to facilitate maintenance. Therefore, disposing a stress concentration portion 23 on the gas supply piping side of the side opposite the reaction tube 4 ensures that the short gas supply pipe 8 is the one that ruptures. Since the long reaction tube-side gas supply pipe 7 need not be replaced, replacement work is economical, and also easy.

Because the quartz used in the reaction chamber of a diffusion furnace such as this is brittle, easily broken, and extremely expensive, huge losses have been incurred in the past as a result of shocks from earthquakes, but the present invention can keep damages to the minimum.

Figure 4:
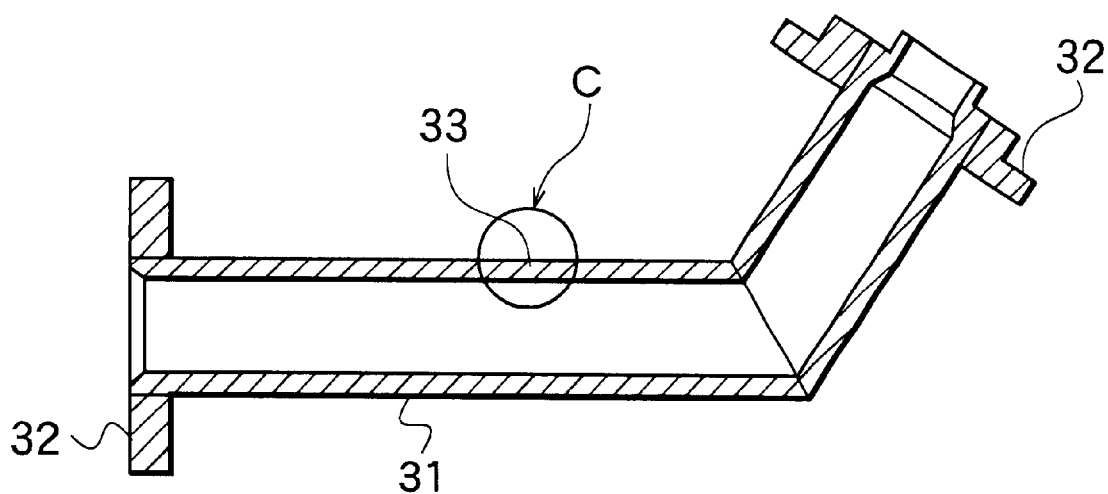
FIG. 4 is a cross-sectional view of a specific gas pipe of an aspect of the embodiment.
Figure 5:
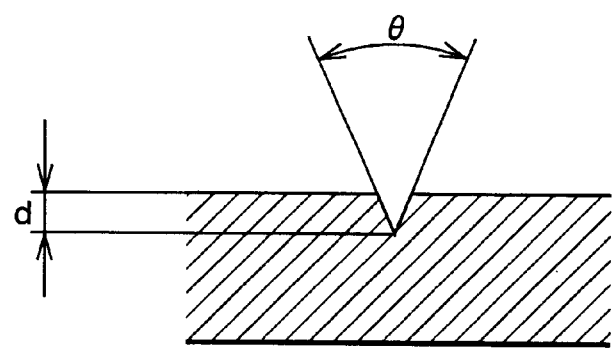
FIG. 5 is an exploded view of portion C of FIG. 4.

FIG. 4, FIG. 5 show the concrete dimensions and shapes of a stress concentration portion. As shown in FIG. 4, a source-side gas supply pipe 31 with flanges 32 at both ends is shorter and more curved than the above-mentioned long, straight reaction tube-side gas supply pipe, has an overall length of 197.43 mm, an outside diameter of 28 mm, and inside diameter of 20 mm, and a pipe thickness of 4 mm. A stress concentration portion 33 is formed approximately in the center of the long-side portion of the bent pipe. Further, it is desirable that the radial-direction depth d of a stress concentration portion 33 formed in the surface of a bent pipe having a thickness of 4 mm be around 1 mm, a depth that will not cause artificial breakage. It is also desirable that the opening angle θ of a V-groove be 45° (FIG. 5).

Figure 6:
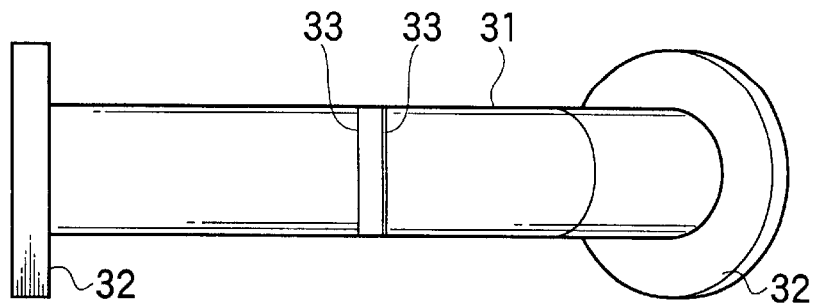
FIG. 6 is a diagram, in which a plurality of stress concentration portions are formed in a gas pipe of an aspect of the embodiment.
Figure 7:
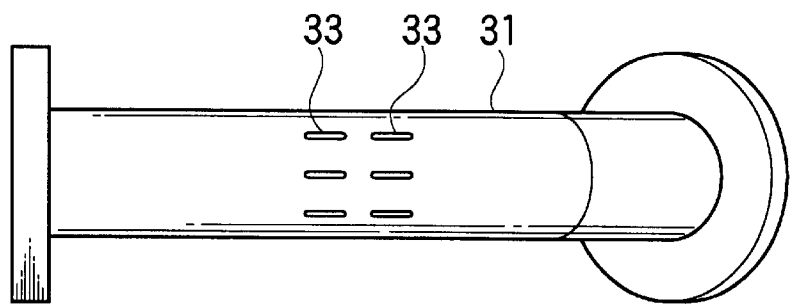
FIG. 7 is a diagram, in which an axially-formed stress concentration portion is formed in a gas pipe of an aspect of the embodiment.
Figure 8:
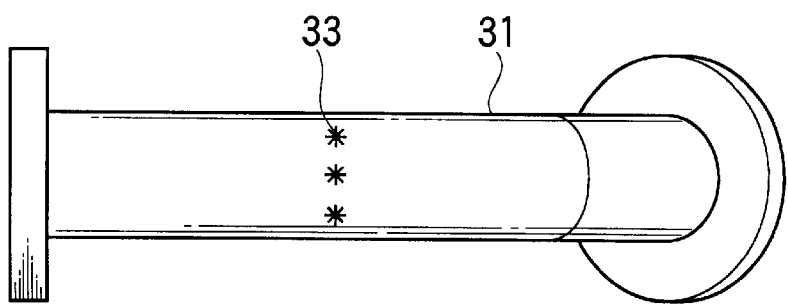
FIG. 8 is a diagram, in which an asterisk-shaped stress concentration portion is formed in a gas pipe of an aspect of the embodiment.
Figure 9:
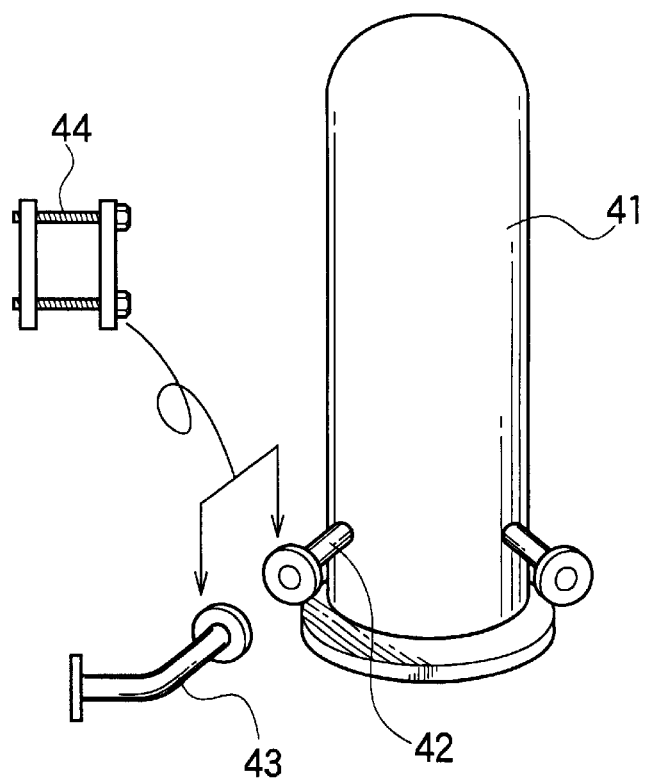
FIG. 9 is a schematic diagram, which shows an essential element of a substrate processing apparatus according to a conventional example, and which shows a connection method of a quartz gas supply portion in a vertical furnace.
Figure 10:
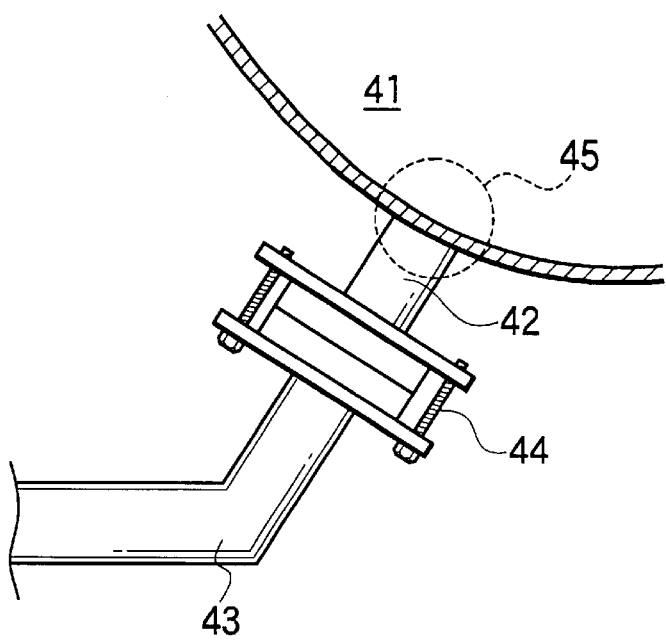
FIG. 10 is an exploded view of a connected quartz gas supply portion, showing an essential element of a substrate processing apparatus according to a conventional example.

Further, a stress concentration portion 33, as shown in FIG. 6, FIG. 7, FIG. 8, can form a plurality of parallel V-grooves that extend around the entire circumference (FIG. 6), or can be non-continuous, and the groove-forming direction can be formed axially instead of circumferentially, and a plurality thereof can be provided (FIG. 7), or can be circumferentially scattered arbitrarily shaped depressions, such as cross-shaped depressions, and asterisk-shaped depressions (FIG. 8), or can be constituted so as to achieve a combination thereof.

As explained hereinabove, in the aspects of the embodiment, a stress concentration portion is formed on gas supply piping so as to cause a rupture in a gas supply pipe of a furnace opening portion before a shock impacts on a reaction tube. Thus, the reaction tube replacement carried out to date becomes unnecessary, and it possible to get by with replacing only a short gas supply pipe. This results in great cost savings. Moreover, because there is no need to disassemble and assemble the central portion of a furnace body as when replacing a long gas supply pipe or reaction tube, apparatus recovery time is greatly shortened (shortened equipment, plant down time), and user inexpedience can be minimized.

In the present invention, it is preferable to form a stress concentration portion on the gas supply piping side as explained in the aspects of the embodiment, rather than on the exhaust piping side. This is because the temperature of the gas supply piping is high, and a bellows cannot be used in a connection between a reaction tube and the gas supply piping. Furthermore, a stress concentration portion is effective even when disposed on the exhaust pipng side, but because the exhaust piping is a portion that protrudes outside of an apparatus main unit, the temperature of the exhaust piping is low, enabling a bellows to be used in a connection between a reaction tube and the exhaust piping. The use of a teflon bellows is especially effective. Therefore, there is no need to dispose a stress concentration portion of the present invention on the exhaust piping side.

In the aspects of the embodiment, the present invention is applied to a normal pressure furnace, such as a diffusion furnace, and an oxidation furnace. Corrosive gases are used in a diffusion furnace, oxidation furnace and other such normal pressure furnaces (for example, water vapor is used in the case of an oxidation furnace). Because metal piping would corrode, quartz piping is used. When quartz piping is used, bellows should be used to counter vibration, but it is impossible to manufacture bellows from quartz. Accordingly, the present invention is particularly effective in normal pressure furnaces like diffusion and oxidation furnaces, in which the gas pipes are constituted from quartz. By contrast, there is little merit in applying the present invention to a low-pressure furnace, since such furnaces are capable of dealing with vibration by using metal bellows in metal pipes.

According to an apparatus of the present invention, because a stress concentration portion is disposed on a gas pipe so as to cause a rupture to occur in the gas pipe before a shock impacts a reaction tube, reaction tube damage can be effectively prevented, and when damage occurs, it is possible to get by with replacing a gas pipe. Therefore, replacement work is easy and economical. Further, according to a method of the present invention, reaction tube damage can be prevented in advance in accordance with a simple method.

What is claimed is:

1. A substrate processing apparatus, which comprises a furnace, having:
    a reaction tube;
    gas piping, which is connected to said reaction tube; and
    a stress concentration portion, which is disposed on said gas piping.

2. The substrate processing apparatus according to claim 1, having:
    a scavenger for preventing the dissipation of gas at the end portion of said furnace,
    said stress concentration portion being disposed on gas piping inside said scavenger.

3. The substrate processing apparatus according to claim 1, wherein said gas piping is connected to said reaction tube by way of a pipe connector, and said stress concentration portion is disposed on said gas piping of the side opposite said reaction tube, having said pipe connector therebetween.

4. The substrate processing apparatus according to claim 1, wherein said stress concentration portion is formed by a groove cut in the radial direction of said gas piping.

5. The substrate processing apparatus according to claim 1, wherein said stress concentration portion is disposed on a gas supply pipe from among the gas piping.

6. The substrate processing apparatus according to claim 1, wherein said furnace is a normal pressure furnace of either a diffusion furnace or an oxidation furnace.

7. A substrate processing method for processing substrates in a reaction tube, wherein a furnace having gas piping connected to the reaction tube and constituted of quartz is provided, and stress for negating an outside force part way along said gas piping is made to occur in a concentrated fashion so that outside force impacting on said furnace travels along said gas piping and is absorbed before reaching said reaction tube.

8. The substrate processing method according to claim 7, wherein a scavenger is provided at an end of said furnace for preventing the dissipation of a gas, and said stress is made to occur in a concentrated fashion part way along said gas piping of inside said scavenger.

9. The substrate processing method according to claim 7, wherein said gas piping is connected to said reaction tube by way of a pipe connector, and said stress is made to occur in a concentrated fashion part way along said gas piping of the side opposite said reaction tube, having said pipe connector therebetween.

10. The substrate processing method according to claim 7, wherein a groove is formed by cutting radially cut part way along said gas piping, and said stress is caused to occur in a concentrated fashion at the location of said groove.

11. The substrate processing method according to claim 7, wherein said stress is caused to occur in a concentrated fashion part way along a gas supply pipe from among said gas piping.

12. The substrate processing method according to claim 7, wherein said furnace is a normal pressure furnace of either a diffusion furnace or an oxidation furnace.

* * * * *